(12) United States Patent
Nishibe et al.

(10) Patent No.: US 7,157,779 B2
(45) Date of Patent: Jan. 2, 2007

(54) SEMICONDUCTOR DEVICE WITH TRIPLE SURFACE IMPURITY LAYERS

(75) Inventors: Eiji Nishibe, Gunma (JP); Toshihiro Hachiyanagi, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/959,402

(22) Filed: Oct. 7, 2004

(65) Prior Publication Data
US 2005/0104138 A1     May 19, 2005

(30) Foreign Application Priority Data
Oct. 9, 2003     (JP) .............................. 2003-351077

(51) Int. Cl.
*H01L 29/78* (2006.01)
(52) U.S. Cl. .............................. 257/408; 257/E21.435; 257/E29.012; 438/302; 438/306; 438/546
(58) Field of Classification Search ................ 257/344, 257/408, 550, 655, 656, 657, E21.345, E29.278, 257/E29.012, E29.266; 438/525, 546, 302, 438/306
See application file for complete search history.

(56) References Cited
U.S. PATENT DOCUMENTS

| | | | | |
|---|---|---|---|---|
| 4,928,163 A | * | 5/1990 | Yoshida et al. ............... | 257/344 |
| 4,935,379 A | * | 6/1990 | Toyoshima ................... | 438/297 |
| 5,308,780 A | * | 5/1994 | Chou et al. ................... | 438/302 |
| 5,362,982 A | * | 11/1994 | Hirase et al. ................ | 257/408 |
| 5,565,700 A | * | 10/1996 | Chou et al. ................... | 257/408 |
| 5,567,965 A | * | 10/1996 | Kim ............................ | 257/336 |
| 5,719,424 A | * | 2/1998 | Ahmad et al. ............... | 257/336 |
| 5,757,045 A | * | 5/1998 | Tsai et al. ................... | 257/336 |
| 5,847,428 A | * | 12/1998 | Fulford et al. ............... | 257/344 |
| 5,869,866 A | * | 2/1999 | Fulford et al. ............... | 257/347 |
| 5,937,293 A | * | 8/1999 | Lee .............................. | 438/247 |
| 5,945,710 A | * | 8/1999 | Oda et al. ................... | 257/344 |
| 5,998,274 A | * | 12/1999 | Akram et al. ................ | 438/306 |
| 6,096,616 A | * | 8/2000 | Nistler et al. ................ | 438/305 |
| 6,218,226 B1 | * | 4/2001 | Lin et al. ..................... | 438/200 |
| 6,274,901 B1 | * | 8/2001 | Odake et al. ................ | 257/315 |
| 6,451,675 B1 | * | 9/2002 | Yeh et al. .................... | 438/527 |

(Continued)

FOREIGN PATENT DOCUMENTS

JP          5-218070          8/1993

*Primary Examiner*—Eugene Lee
*Assistant Examiner*—William F. Kraig
(74) *Attorney, Agent, or Firm*—Morrison & Foerster LLP

(57) ABSTRACT

An operational withstand voltage of a high voltage MOS transistor is enhanced and a variation in a saturation current Idsat is suppressed. A gate insulation film is formed on a P-type semiconductor substrate. A gate electrode is formed on the gate insulation film. A first low impurity concentration source layer and a first low impurity concentration drain layer are formed by tilt angle ion implantation of double charge phosphorus ions ($^{31}P^{++}$) using the gate electrode as a mask. Then a second low impurity concentration source layer and a second low impurity drain layer are formed by tilt angle ion implantation of single charge phosphorus ions ($^{31}P^{+}$). Furthermore, surface injection layers are formed by implanting arsenic ions ($^{75}As^{+}$) shallowly into the surface of the semiconductor substrate, in which the first low impurity concentration source layer, the first low impurity concentration drain layer, the second low impurity concentration source layer and the second low impurity concentration drain layer are already formed, so that the impurity concentration in an uppermost surface of the P-type semiconductor substrate is increased.

2 Claims, 5 Drawing Sheets

U.S. PATENT DOCUMENTS

| | | |
|---|---|---|
| 6,576,965 B1 * | 6/2003 | Eikyu et al. ................. 257/408 |
| 6,589,847 B1 * | 7/2003 | Kadosh et al. .............. 438/302 |
| 6,597,038 B1 * | 7/2003 | Hashimoto ................. 257/344 |
| 6,888,191 B1 | 5/2005 | Aoki |
| 2002/0125531 A1 * | 9/2002 | Kikuchi et al. ............. 257/344 |
| 2002/0153562 A1 * | 10/2002 | Lee et al. ................... 257/344 |
| 2003/0146458 A1 * | 8/2003 | Horiuchi et al. ............ 257/288 |

* cited by examiner

SEMICONDUCTOR DEVICE WITH TRIPLE SURFACE IMPURITY LAYERS

CROSS-REFERENCE OF THE INVENTION

This invention is based on Japanese Patent Application No. 2003-351077, the content of which is incorporated herein by reference in its entirety.

BACKGROUND OF THE INVENTION

1. Field of the Invention

This invention relates to a semiconductor device and its manufacturing method, specifically to a structure and a manufacturing method of a high voltage MOS transistor.

2. Description of the Related Art

FIG. 5 is a cross-sectional view showing a structure of an N-channel high voltage MOS transistor according to a prior art. A gate electrode 52 is formed on a P-type silicon substrate 50 through a gate insulation film 51. A sidewall spacer 53 made of an insulation film is formed on each sidewall of the gate electrode 52. A source layer 54 composed of an N$^-$-type source layer 54a and an N$^+$-type source layer 54b and a drain layer 55 composed of an N$^-$-type drain layer 55a and an N$^+$-type drain layer 55b are formed.

The high voltage MOS transistor attains a high drain withstand voltage by placing the N$^-$-type drain layer 55a adjacent the gate electrode 52 and placing the N$^+$-type drain layer 55b away from the gate electrode 52 to relax a drain electric field.

Further description on such a high voltage MOS transistor is found, for example, in Japanese Patent Publication No. H05-218070.

In order to enhance the drain withstand voltage, it is necessary that a dose of implanted ions to form the N$^-$-type drain layer 55a is decreased to reduce an impurity concentration in the N$^-$-type drain layer 55a. When the impurity concentration in the N$^-$-type drain layer 55a is simply reduced, however, the impurity concentration may become too low in an uppermost surface of the N$^-$-type drain layer 55a.

When a channel current flows through the high voltage MOS transistor having the N$^-$-type drain layer 55a of the excessively reduced impurity concentration, there arises a problem that a saturation current Idsat of the high voltage MOS transistor substantially varies with injection of hot carriers into the gate insulation film 51 induced by the channel current. If the impurity concentration is not reduced, on the other hand, there is a problem that the operational withstand voltage (a drain withstand voltage when the MOS transistor is turned on) is low.

FIG. 4B shows characteristics of source-drain current Ids before and after the injection of the hot carriers. The substantial variation in the saturation current Idsat of the MOS transistor is due to a change in resistance of the uppermost surface of the N$^-$-type drain layer 55a caused by electric charge of the hot carriers trapped in the gate insulation film 51.

SUMMARY OF THE INVENTION

This invention provides a semiconductor device including a semiconductor substrate, a gate electrode formed on the semiconductor substrate through a gate insulation film, a first low impurity concentration drain layer formed in a surface of the semiconductor substrate and extending below the gate electrode, a surface injection layer formed in the semiconductor substrate on the first low impurity concentration drain layer and having higher impurity concentration than the first low impurity concentration drain layer, and a high impurity concentration drain layer formed in the surface of the semiconductor substrate.

This invention also provides a manufacturing method of a semiconductor device. The method includes forming a gate insulation film on a semiconductor substrate of a first conductivity type, forming a gate electrode on the gate insulation film, implanting impurity ions of a second conductivity type deep into the semiconductor substrate at a first tilt angle using the gate electrode as a mask to form a first low impurity concentration drain layer, and implanting impurity ions of the second conductivity type shallowly into the semiconductor substrate at a second tilt angle using the gate electrode as a mask to increase an impurity concentration in a surface of the first low impurity concentration drain layer.

DETAILED DESCRIPTION OF THE INVENTION

Next, an embodiment of this invention will be described. A semiconductor device and its manufacturing method according to the embodiment of this invention will be explained referring to FIG. 1A through FIG. 2B.

Figure 1A:
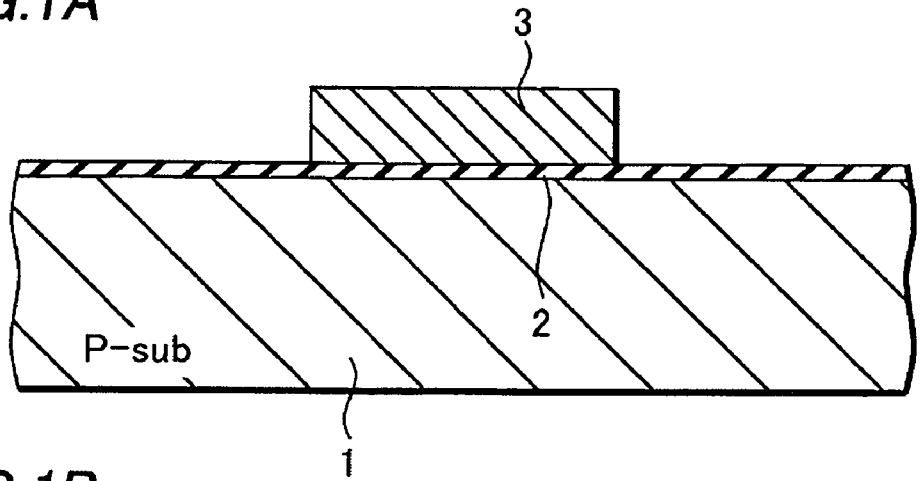
FIGS. 1A, 1B and 1C are cross-sectional views showing a manufacturing method of a semiconductor device according an embodiment of this invention.

A gate insulation film 2 is formed on a surface of a P-type semiconductor substrate 1 (e.g. a P-type silicon substrate) by thermal oxidation, for example, as shown in FIG. 1A. A gate electrode 3 is formed on the gate insulation film 2. In this process, a polysilicon layer is deposited over the entire surface of the semiconductor substrate 1 by LPCVD (Low Pressure Chemical Vapor Deposition), doped with impurity such as phosphorus to reduce resistivity and then selectively etched to form the gate electrode 3.

Figure 1B:
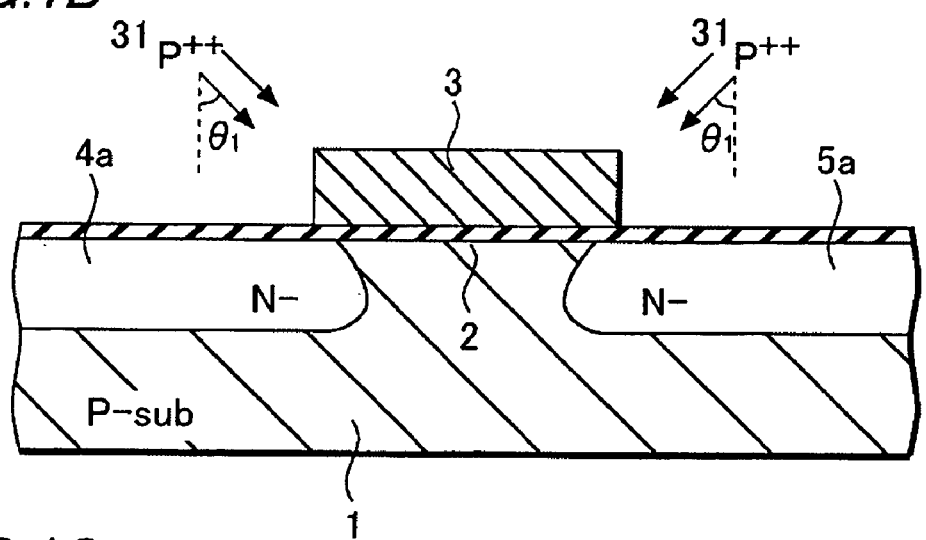

Next, a first low impurity concentration source layer 4a and a first low impurity concentration drain layer 5a are formed by implanting double charge phosphorus ions ($^{31}$P$^{++}$) at a tilt angle under the condition that the ions do not penetrate the gate electrode 3 which is used as a mask, as shown in FIG. 1B.

The incident angle $\theta_1$ of a beam of the double charge phosphorus ions is 45 degree relative to the direction normal to the surface of the semiconductor substrate 1. In order to maintain symmetry between the source and the drain, the tilt angle ion implantation needs to be made from right and left directions. Considering a variety of layouts of the high voltage MOS transistors, in order to maintain the symmetry between the source and the drain regardless of the layout, it is preferable that the tilt angle ion implantation is performed while the ion beam rotates around the semiconductor substrate 1. This is made either by rotating an ion gun emitting the ion beam while the P-type semiconductor substrate 1 is fixed, or by rotating the P-type semiconductor substrate 1 while the ion gun is fixed.

The ion beam reaches up to a region below the gate electrode 3 by the tilt angle ion implantation. Thus the first low impurity concentration drain layer 5a is extended to the region below the gate electrode 3, adding an extended region (an extended drift region for charge carriers) to the first low impurity concentration drain layer 5a. This enables enhancing the operational withstand voltage without any change in size of the MOS transistor. The incident angle of the ion beam is most preferably 45 degrees relative to the direction normal to the surface of the semiconductor substrate 1. Not limited to that, the incident angle within a range between 35 degrees and 55 degrees is effective to some extent.

In order to relax the drain electric field, the first low impurity concentration drain layer 5a needs to be formed deep. Thus, an acceleration voltage of 100 KeV (200 KeV in effect, because the implanted ions are double charge ions) and a dose of $1.8\times10^{13}/cm^3$ are preferable. It is noted that singly charged ions, such as $^{31}P^+$, may also be used with a higher acceleration voltage.

Figure 1C:
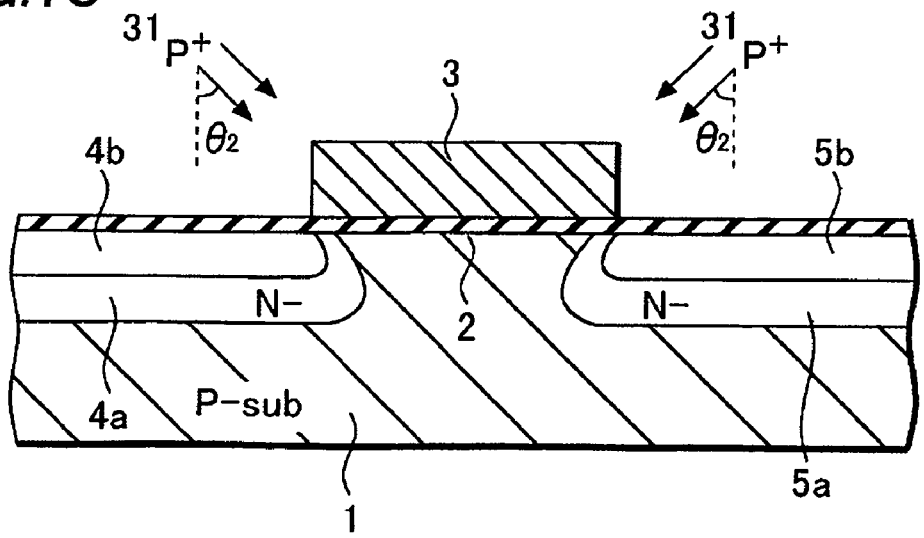

Next, a second low impurity concentration source layer 4b and a second low impurity concentration drain layer 5b are formed by implanting single charge phosphorus ions ($^{31}P^+$) at a tilt angle under the condition that the ions do not penetrate the gate electrode 3 which is used as a mask, as shown in FIG. 1C. The second low impurity concentration source layer 4b and the second low impurity concentration drain layer 5b are formed to overlap, to be shallower than and to have lower impurity concentration than the first low impurity concentration source layer 4a and the first low impurity concentration drain layer 5a, respectively.

This ion implantation is preferably made under an acceleration voltage of 100 KeV and a dose of $1\times10^{12}/cm^3$. This ion implantation is the tilt angle ion implantation similar to the one used in the implantation of the double charge phosphorus ions ($^{31}P^{++}$) shown in FIG. 1B. The incident angle $\theta_2$ of a beam of the single charge phosphorus ions is preferably 45 degrees relative to the direction normal to the surface of the semiconductor substrate 1.

Figure 2A:
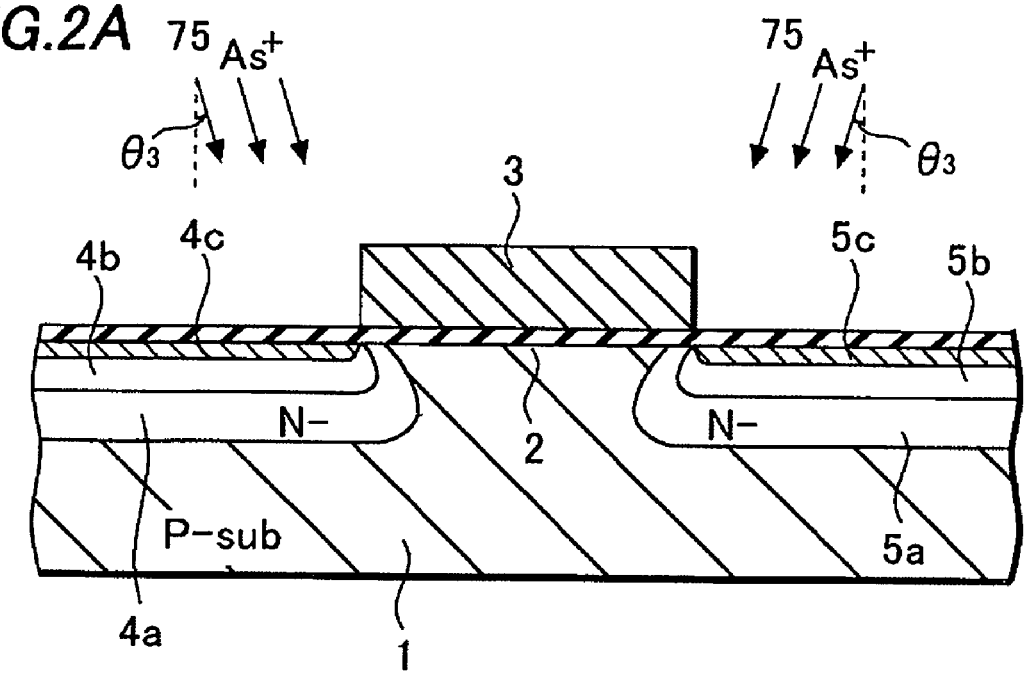
FIGS. 2A and 2B are cross-sectional views showing the manufacturing method of the semiconductor device according the embodiment of this invention.

Next, as shown in FIG. 2A, surface injection layers 4c and 5c are formed by implanting arsenic ions ($^{75}As^+$) shallowly into the surface of the semiconductor substrate 1, in which the first low impurity concentration source layer 4a, the first low impurity concentration drain layer 5a, the second low impurity concentration source layer 4b and the second low impurity concentration drain layer 5b are already formed, under the condition that the ions do not penetrate the gate electrode 3 which is used as a mask, in order to increase an impurity concentration in an uppermost surface of the P-type semiconductor substrate 1. The surface injection layers 4c and 5c enhance the operational withstand voltage of the high voltage MOS transistor as well as suppressing the variation in the saturation current Idsat. It is noted that phosphorus may be used in this step to replace arsenic ions.

This ion implantation is preferably made under the condition that an acceleration voltage of 70 KeV and a dose of $3\times10^{12}/cm^3$. An incident angle $\theta_3$ of a beam of the arsenic ions is fpreferably smaller than the incident angles $\theta_1$ and $\theta_2$ in the preceding ion implantations. The reason is to prevent the surface injection layers 4c and 5c from being formed below the gate electrode 3 and reducing the drain withstand voltage.

To be more specific, the incident angle $\theta_3$ of the ion beam is preferably 7 degrees relative to the direction normal to the surface of the semiconductor substrate 1. The incident angle $\theta_3$ of the ion beam may be around zero degree. However, prevention of channeling has to be taken into consideration in this case.

Figure 2B:
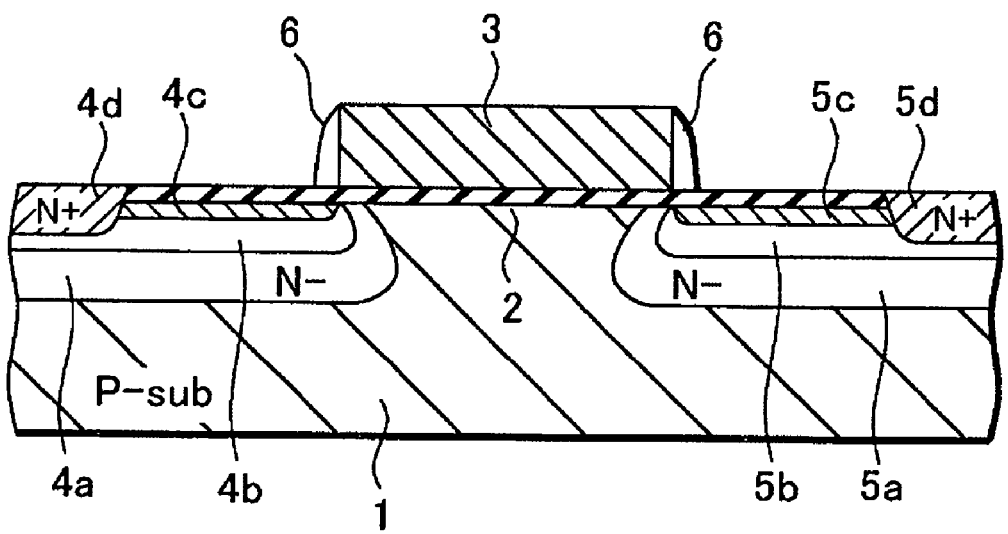

Next, a sidewall spacer 6 is formed on each sidewall of the gate electrode 3, as shown in FIG. 2B. In this process, an insulation film such as a silicon oxide film is deposited over the entire surface of the semiconductor substrate 1 by LPCVD. The sidewall spacer 6 is formed on each sidewall of the gate electrode 3 by etching the insulation film anisotropically. Then, a high dose of N-type impurity ions such as phosphorus or arsenic is implanted into the surface of the P-type semiconductor substrate 1 to form a high impurity concentration source layer 4d and a high impurity concentration drain layer 5d adjacent to or away from the gate electrode 3.

The high impurity concentration source layer 4d and the high impurity concentration drain layer 5d have higher impurity concentrations than any of the first low impurity concentration source layer 4a, the first low impurity concentration drain layer 5a, the second low impurity concentration source layer 4b, the second low impurity concentration drain layer 5b and the surface injection layers 4c and 5c. The high impurity concentration drain layer 5d is preferably formed away from an edge of the gate electrode 3 in order to prevent a drain leakage current GIDL (Gate Induced Drain Leakage Current) from occurring, which would be induced by a strong electric field at the edge of the gate electrode 3.

Figure 3A:
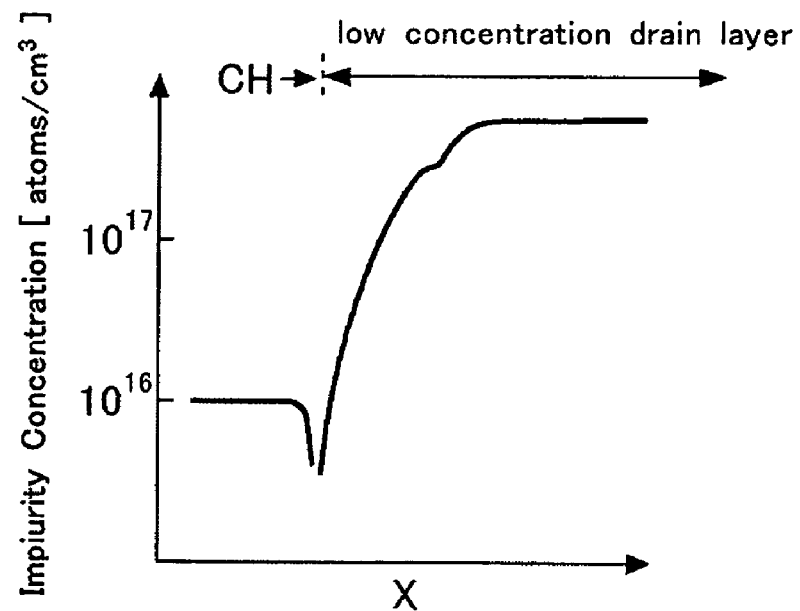
FIG. 3A shows an impurity concentration profile along the uppermost surface of a P-type semiconductor substrate of a high voltage MOS transistor according to the embodiment of this invention.
Figure 3B:
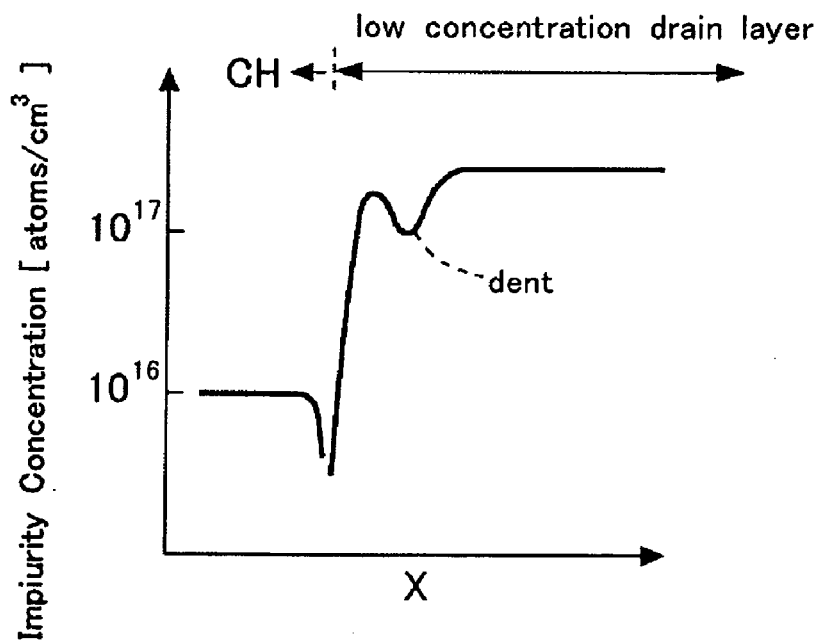
FIG. 3B shows an impurity concentration profile along the uppermost surface of a P-type semiconductor substrate of a high voltage MOS transistor according to a prior art.

FIG. 3A shows an impurity concentration profile along the uppermost surface of the P-type semiconductor substrate 1 of the high voltage MOS transistor according to the embodiment of this invention, while FIG. 3B shows an impurity concentration profile along the uppermost surface of the P-type semiconductor substrate of the high voltage MOS transistor according to the prior art. In FIG. 3A, the impurity concentration profile in the low impurity concentration drain layers (the first low impurity concentration drain layer 5a, the second low impurity concentration drain layer 5b and the surface injection layer 5c) is shown to the right of a channel region CH of the high voltage MOS transistor.

Figure 4A:
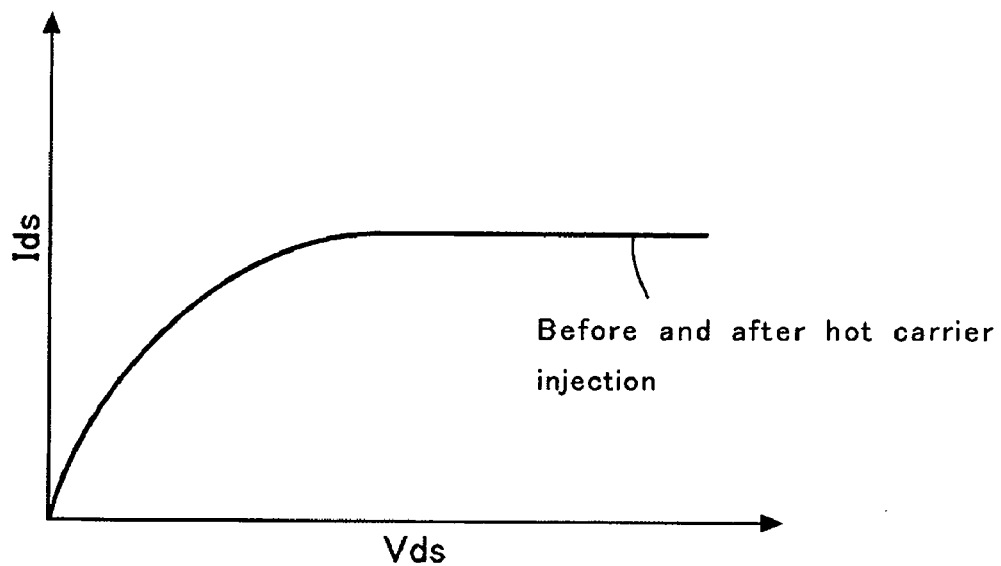
FIG. 4A shows source-drain current Ids as a function of drain-source voltage before and after injection of hot carriers according to the embodiment of this invention.
Figure 4B:
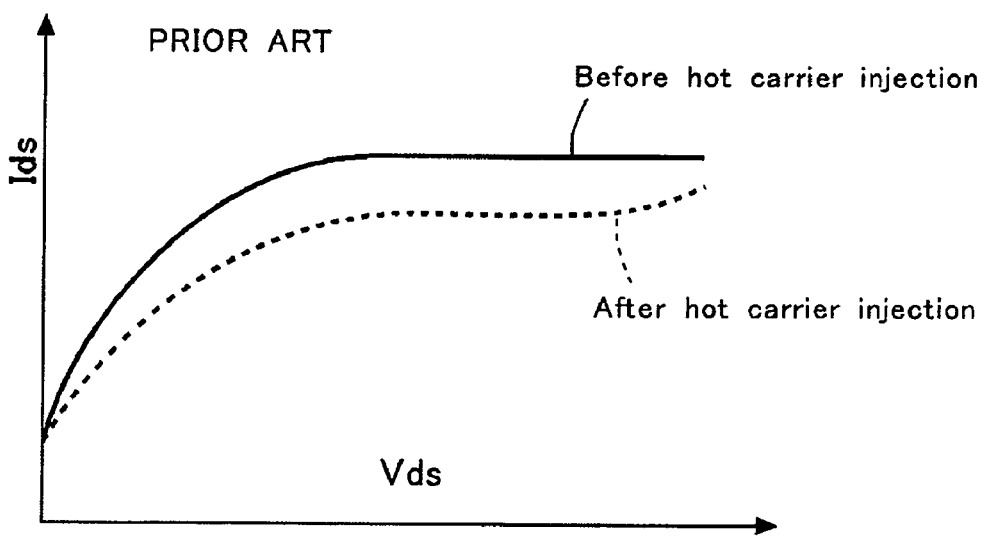
FIG. 4B shows source-drain current Ids as a function of the drain-source voltage before and after injection of hot carriers according to the prior art.
Figure 5:
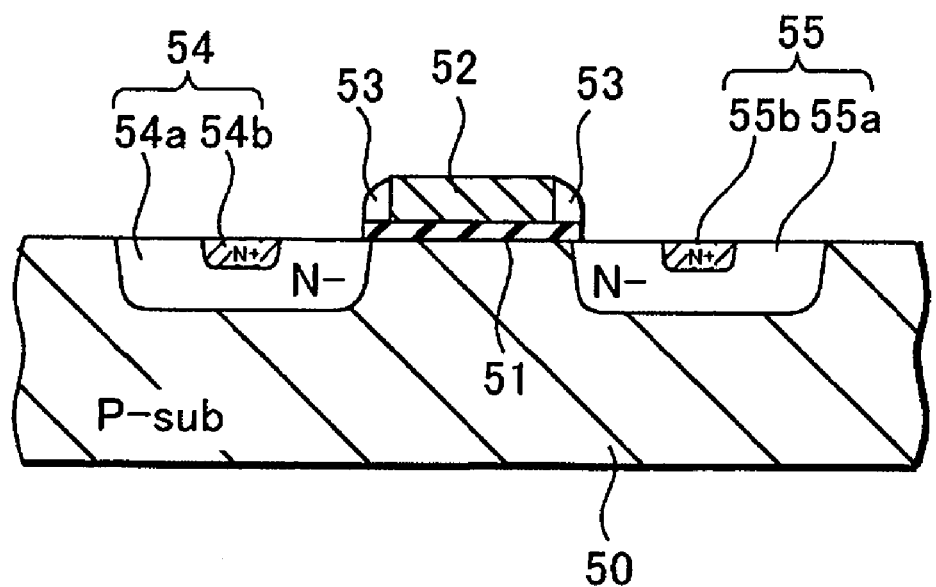
FIG. 5 is a cross-sectional view showing the semiconductor device according to the prior art.

There appears a dent in the impurity concentration profile at an edge of the low impurity concentration drain layers of the prior art shown in FIG. 3B. It represents a location where the impurity concentration decreases abruptly, and it causes the change in the resistance and the variation in the saturation current Idsat due to the hot carrier injection. On the other hand, there is no dent in the impurity concentration profile of the embodiment, as shown in FIG. 3A. The forming of the surface injection layer 5c eliminates the dent in the concentration profile shown in FIG. 3B. As a result, there is no variation in the saturation current Idsat due to the hot carrier injection, as shown in FIG. 4A.

Also, while there is a steep change in the impurity profile in the low impurity concentration drain layer according to the prior art as shown in FIG. 3B, the impurity profile of the embodiment changes gradually as shown in FIG. 3A, that is, the impurity concentration changes gradually along the uppermost surface of the P-type semiconductor substrate 1. This is achieved by providing the first low impurity concentration drain layer 5a. As a result, the operational withstand voltage and the drain withstand voltage are prevented from decreasing.

Furthermore, because the first low impurity concentration drain layer 5a extends to the region below the gate electrode 3 according to the embodiment, following effect is also obtained. Assume that a drain voltage Vd is applied to the high impurity concentration drain layer 5d, while a gate voltage Vg is applied to the gate electrode 3. A surface depletion layer is induced in a surface of the first low impurity concentration drain layer 5a overlapping the gate electrode 3, when a drain-source voltage Vds is higher than a gate-source voltage Vgs (Vds>Vgs). Consequently, a channel current (electron current) of the high voltage MOS transistor flows through a deep region of the first low impurity concentration drain layer 5a under the surface depletion layer to avoid flowing through the surface region at the edge of the first low impurity concentration drain layer 5a where the electric field converges. This results in a reduced substrate current Isub and an improved operational withstand voltage.

Although a source side has the identical structure as a drain side in the embodiment, the source side may be made of the high impurity concentration source layer 4d only, when a high voltage is applied only to the drain side.

The operational withstand voltage of the high voltage MOS transistor is enhanced and the variation in the saturation current Idsat is suppressed according to this embodiment because the drain electric field is relaxed by the first low impurity concentration drain layer and because the surface injection layer having higher impurity concentration than the first low impurity concentration drain layer is formed in the uppermost surface of the semiconductor substrate on the first low impurity concentration drain layer.

What is claimed is:

1. A semiconductor device comprising:
   a semiconductor substrate of a first general conductivity type;
   a gate insulation film disposed on the semiconductor substrate;
   a gate electrode disposed on the gate insulation film;
   a first low impurity concentration drain layer formed in a surface of the semiconductor substrate and extending below the gate electrode, the first low impurity concentration drain layer being of a second general conductivity type;
   a surface injection layer formed in the surface of the semiconductor substrate and covering part of the first low impurity concentration drain layer, the surface injection layer having an impurity concentration higher than an impurity concentration of the first low impurity concentration drain layer and being of the second general conductivity type;
   a high impurity concentration drain layer formed in the surface of the semiconductor substrate and electrically connected to the first low impurity concentration drain layer, the high impurity concentration drain layer being of the second general conductivity type; and
   a second low impurity concentration drain layer formed in the semiconductor substrate shallower than the first low impurity concentration drain layer and deeper than the surface injection layer, the second low impurity concentration drain layer having an impurity concentration lower than the impurity concentration of the first low impurity concentration drain layer and being of the second conductivity type.

2. The semiconductor device of claim 1, wherein an impurity concentration of the high impurity concentration drain layer is higher than the impurity concentration of the surface injection layer.

* * * * *